(12) United States Patent
Priewasser (10) Patent No.: US 7,115,485 B2
(45) Date of Patent: Oct. 3, 2006

(54) METHOD FOR PROCESSING WAFER (75) Inventor: Karl Heinz Priewasser, Munich (DE)

(73) Assignee: Disco Corporation, Tokyo (JP)

( * ) Notice: Subject to any disclaimer, the term of this patent is extended or adjusted under 35 U.S.C. 154(b) by 90 days.

(21) Appl. No.: 10/947,242

(22) Filed: Sep. 23, 2004

(65) Prior Publication Data
US 2005/0070072 A1   Mar. 31, 2005

(30) Foreign Application Priority Data

Sep. 26, 2003 (JP) ............... 2003-335238
Apr. 30, 2004 (JP) ............... 2004-135704

(51) Int. Cl.
H01L 21/78 (2006.01)
(52) U.S. Cl. ................................. 438/464
(58) Field of Classification Search ........... 438/458, 438/459, 460, 462, 464
See application file for complete search history.

(56) References Cited

U.S. PATENT DOCUMENTS

| | | | |
|---|---|---|---|
| 6,888,230 B1 * | 5/2005 | Ogino et al. ............... | 257/669 |
| 6,905,946 B1 * | 6/2005 | Grigg et al. ............... | 438/459 |
| 2003/0003688 A1 * | 1/2003 | Tandy et al. ............... | 438/459 |
| 2004/0023043 A1 * | 2/2004 | Ishikawa et al. ............ | 428/447 |

FOREIGN PATENT DOCUMENTS

| | | | | |
|---|---|---|---|---|
| JP | 02137227 A | * | 5/1990 | ............... 438/464 |
| JP | 2003-209083 | | 7/2003 | |
| JP | 2004-022634 | | 1/2004 | |

* cited by examiner

Primary Examiner—Scott B. Geyer
Assistant Examiner—Amy Mangrum
(74) Attorney, Agent, or Firm—Wenderoth, Lind & Ponack, L.L.P.

(57) ABSTRACT

To facilitate handling a wafer during processing even when the wafer is formed thin, a protective member is stuck through an adhesive agent to an outer-peripheral surplus region of a front surface of the wafer, the region being formed with no individual devices, and a back surface of the wafer is ground in a state where the whole front surface of the wafer is supported by the protective member. Since an outer periphery of the wafer is reinforced by the protective member, the wafer can be easily handled even after having been thinned by the grinding.

4 Claims, 10 Drawing Sheets

METHOD FOR PROCESSING WAFER

BACKGROUND OF THE INVENTION

1. Field of the Invention

The present invention relates to a method for processing a wafer to facilitate the handling of the wafer formed thin.

2. Related Art

A wafer in which a plurality of devices such as ICs or LSIs are formed on its front surface side, is split into the individual devices by employing a dicing apparatus or the like. The devices are assembled in various electronic equipment, and are extensively used. Besides, in order to attain a smaller size, a lighter weight, etc. for the electronic equipment, the wafer before being split into the individual devices is formed to a thickness of, for example, 100 m –50 m by grinding the back surface thereof.

In this regard, when the wafer is thinned by the grinding, its rigidity is lost, so that the wafer becomes difficult to handle in later steps. By way of example, it becomes difficult to cover the back surface of the wafer with a metal film made of gold, silver, titanium or the like, for the purpose of a probe test, and electrical testing of the devices become difficult. Therefore, a technique wherein the back surface of the wafer is ground in a state where a supporter is bonded to the front surface has been proposed with the intention of facilitating the handling (refer to, for example, JP-A-2004-22634 and JP-A-2003-209083).

However, when the supporter is bonded to the front surface of the wafer, it needs to be torn off later. This poses the problem that, even after the supporter has been torn off, an adhesive agent sometimes remains on the devices formed in the front surface. A troublesome operation is required for completely removing the adhesive agent, and the handling of the wafer becomes difficult in this respect.

SUMMARY OF THE INVENTION

An object of the present invention is to provide a method for processing a wafer in which the wafer thinned by grinding is stably supported and any troublesome operation is dispensed with, thereby facilitating the handling of the wafer in later working steps.

A method for processing a wafer according to the invention consists in a method for processing a wafer whose front surface includes a device region formed with a plurality of devices, and an outer-peripheral surplus region surrounding the device region, comprising at least a protective-member sticking step of sticking a protective member to the outer-peripheral surplus region through an adhesive agent; and a back-surface grinding step of grinding a back surface of the wafer with the protective member held on a chuck table of a grinding apparatus.

A back-surface grinding step may be followed by a film formation step of forming a film on the back surface of the wafer bearing the protective member stuck to the front surface.

Besides, the method for processing a wafer may further comprise a protective-member cutting step of cutting the protective member by applying a cutting blade to the protective member and while the protective member and the cutting blade are being relatively rotated, so that the protective member stuck to the outer-peripheral surplus region may remain in a ring shape; and a test step of removing the part of the protective member covering the device region cut at said protective-member cutting step to expose the device region and electrically testing the devices.

Further, a dicing step of dicing the wafer into the individual devices may be comprised, and the dicing step should preferably be preceded by an outer-peripheral-surplus-region separation step of separating the outer-peripheral surplus region from the device region by cutting the wafer along an inner periphery of the protective member remaining in the ring shape.

It is desirable that the protective member be formed of any of glass, silicon and ceramics, while the adhesive agent be formed of a polyimide resin, but the invention shall not be restricted to these materials.

In the invention, the back surface of the wafer is ground in the state where the protective member is stuck through the adhesive agent to the outer-peripheral surplus region of the front surface of the wafer, and where the protective member side is held on the chuck table of the grinding apparatus. Therefore, even when the wafer is made as thin as, for example, 100 μm–50 μm by the grinding, it is reinforced by the protective member, so that it can be easily handled. Moreover, the adhesive agent adheres to only the outer-peripheral surplus region, and it does not adhere to the device region, so that such a troublesome operation as removing the adhesive agent later is dispensed with.

Besides, at the film formation step of forming the film on the back surface of the wafer bearing the protective member stuck to the front surface, the plane of the wafer is in a flat state owing to the reinforcement by the protective member, so that the handling of the wafer is easy, and the metal film can be formed homogeneously and flatly.

Further, owing to the protective-member cutting step of cutting the protective member so that the part thereof stuck to the outer-peripheral surplus region may remain in the ring shape, and the test step of removing the part of the protective member other than the ring-shaped part and thus exposing the device region and electrically testing the devices, the test step is carried out in the state where the outer-peripheral surplus region is supported by the protective member, so that the supported state of the wafer is stabilized.

At the dicing step of dicing the wafer into the individual devices, the protective member remaining in the ring shape can be cut together with the wafer. Alternatively, the wafer can be diced into the individual devices after the outer-peripheral surplus region has been separated from the device region by cutting the wafer along the inner periphery of the protective member remaining in the ring shape.

DETAILED DESCRIPTION OF PREFERRED EMBODIMENTS

Figure 1:
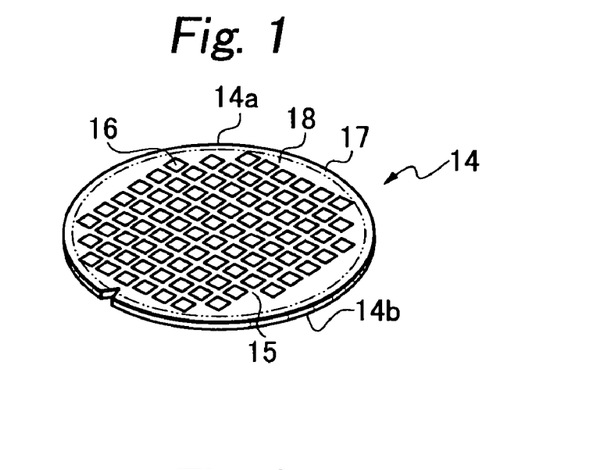
FIG. 1 is a perspective view showing an example of a wafer.

A large number of devices 16 are formed in the front surface 14a of a wafer 14 shown in FIG. 1, in a state where they are demarcated by streets 15 formed so as to extend vertically and horizontally. The chips of the individual devices 16 are obtained by cutting the wafer 14 vertically and horizontally along the streets 15 demarcating these devices. The front surface 14a of the wafer 14 includes a device region 18 in which the devices 16 are formed, and an outer-peripheral surplus region 17 which surrounds the device region 18 and in which no devices are formed. Each individual device 16 may be formed with a bump.

Figure 2:
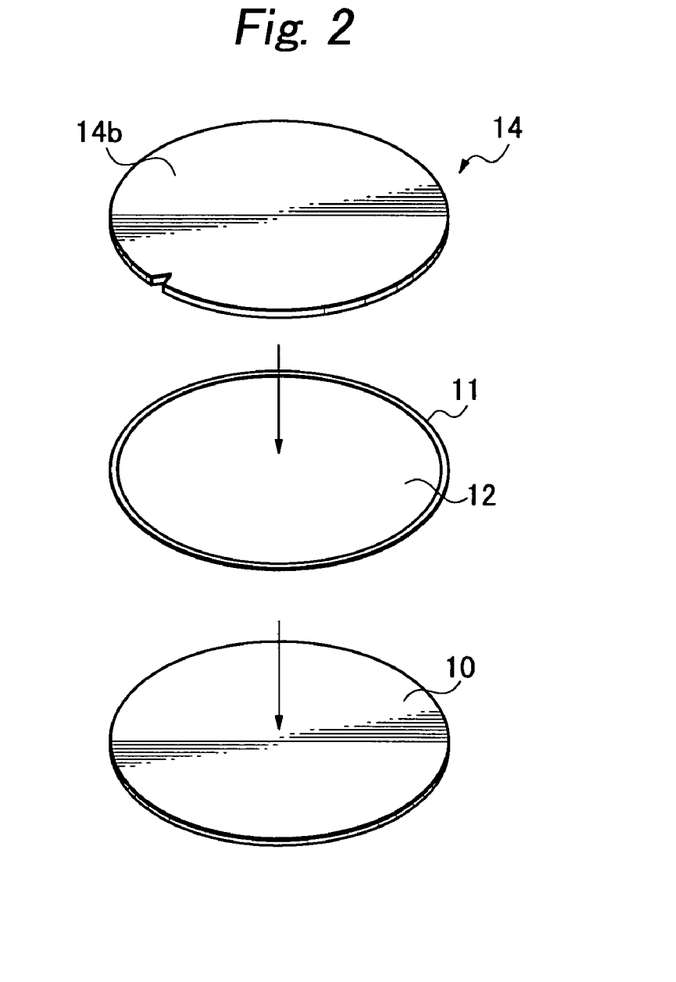
FIG. 2 is a perspective view showing examples of the wafer, an adhesive agent and a protective member.
Figure 3:
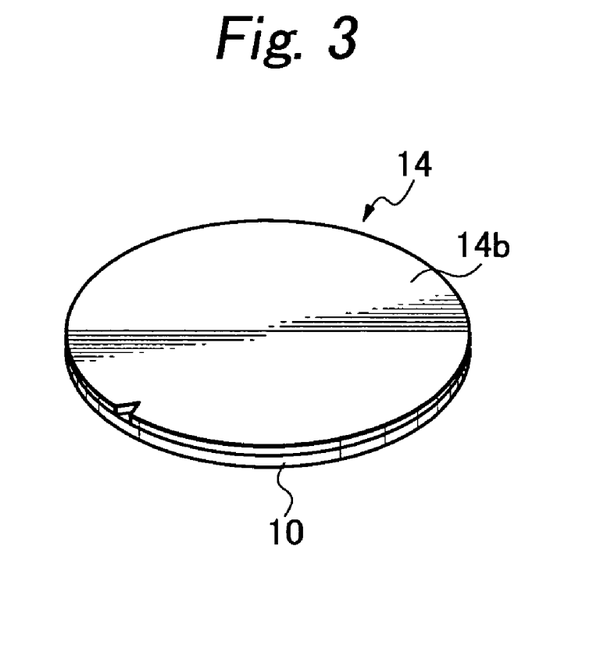
FIG. 3 is a perspective view showing the wafer to which the protective member is stuck.
Figure 4:
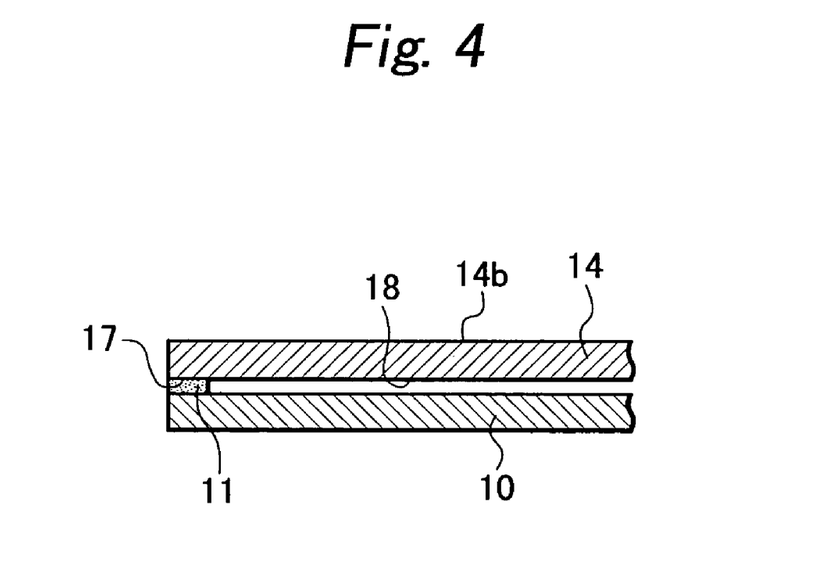
FIG. 4 is a sectional view showing the wafer to which the protective member is stuck.

For the purpose of forming the wafer 14 to a desired thickness, the back surface 14b thereof needs to be ground. Before the grinding, as shown in FIG. 2, a protective member 10 is stuck to the outer-peripheral surplus region 17 in the front surface 14a of the wafer 14 through a ring-shaped adhesive agent 11 having an opening 12. Thus, as shown in FIGS. 3 and 4, a state is established where the wafer 14 and the protective member 10 are integral through the adhesive agent 11 (protective-member sticking step). The adhesive agent 11 is made of, for example, a polyimide resin, and its thickness should preferably be as extraordinarily small as about 5 m. However, in a case where the bumps are formed in the device region 18, the adhesive agent 11 is endowed with a thickness equal to the height of each bump, in order to prevent damage to the wafer 14 due to the concentration of stresses at the bumps in later steps, and the adhesive agent 11 does not adhere to the device region 18. Besides, the protective member 10 may be formed of silicon, glass, ceramics or the like. In the illustrated example, the protective member 10 is formed into a circular shape having the same outside diameter as that of the wafer 14. It should preferably have a thickness of, for example, about 500 m.

When the wafer 14 and the protective member 10 have been stuck through the adhesive agent 11 in this way, the back surface of the wafer 14 is subsequently ground (back-surface grinding step). A grinding apparatus 1 shown in FIG. 5 by way of example can be employed for the back-surface grinding step.

Figure 5:
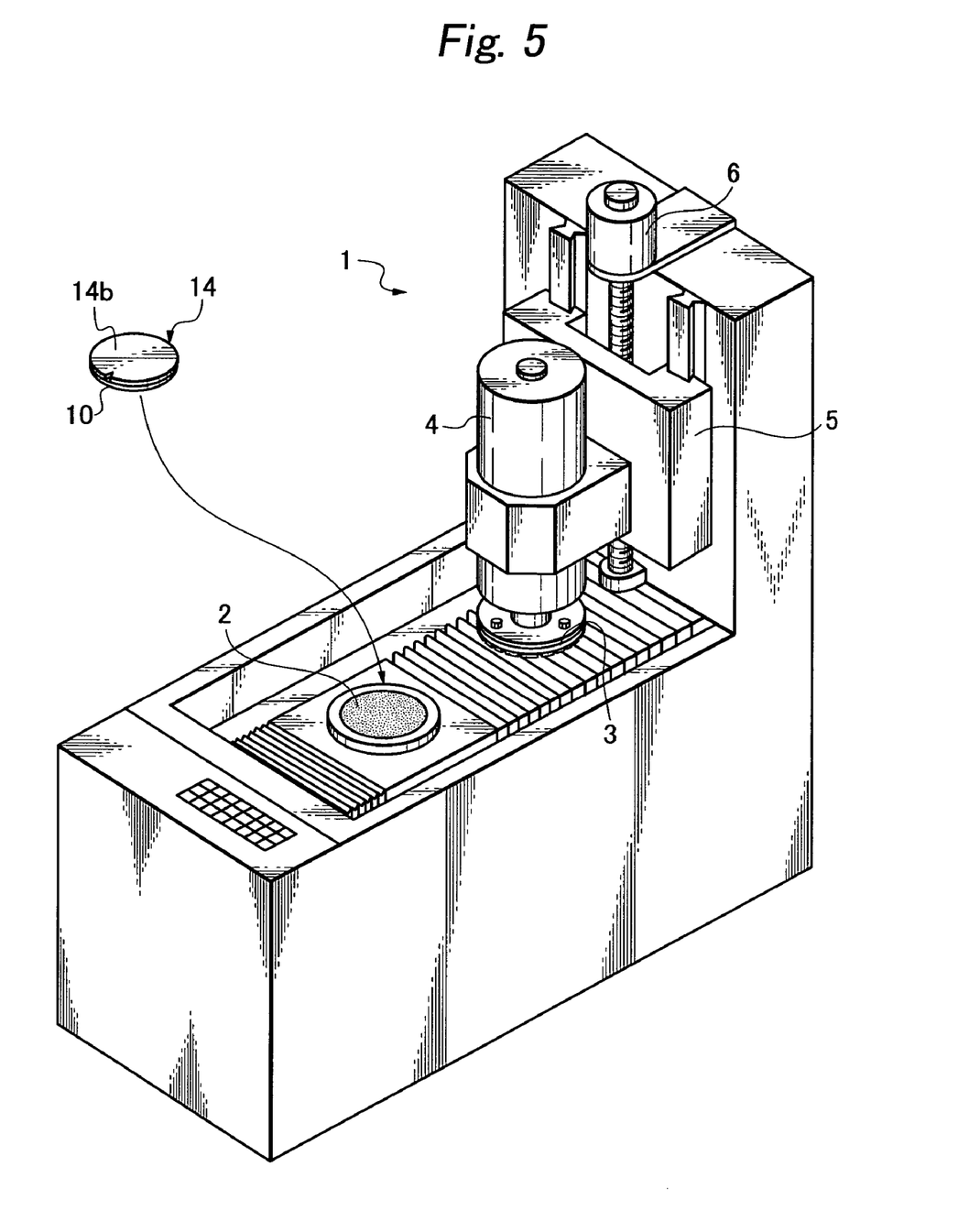
FIG. 5 is a perspective view showing an example of a grinding apparatus.

The grinding apparatus 1 includes, at least, a chuck table 2 which can rotate while holding the wafer assembly (the wafer 14 with the protective member 10 stuck thereto), a grindstone 3 which rotates with the rotation of a spindle, a drive unit 4 which rotationally drives the grindstone 3, a guide unit 5 which supports the drive unit 4 so as to guide the movement thereof in a vertical direction, and a moving drive unit 6 which moves the grindstone 3 as well as the drive unit 4 precisely in the vertical direction through the guide unit 5.

After the protective member 10 has been stuck to the wafer 14, the wafer assembly is placed and held on the chuck table 2 of the grinding device 1 with the back surface 14b facing up and the protective member 10 facing down. Subsequently, the chuck table 2 is moved so as to locate the wafer assembly just under the grindstone 3. Thereafter, the grindstone 3 is lowered while being rotated, into contact with the back surface 14b of the wafer 14, whereby the back-surface grinding step is carried out. During the grinding, the device region 18 of the wafer 14 is protected by the protective member 10.

Figure 6:
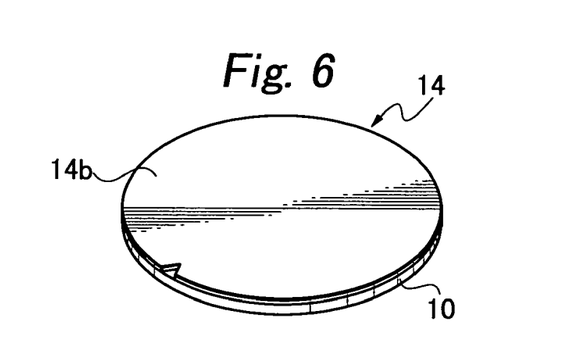
FIG. 6 is a perspective view showing the wafer and the protective member after grinding the back surface of the wafer.

As shown in FIG. 6, the wafer 14 whose back surface 14b has been ground becomes thin and bears the protective member 10 stuck over the front surface 14a. In this state left intact, a metal film made of gold, silver, titanium or the like is subsequently formed on the back surface 14b.

Figure 7:
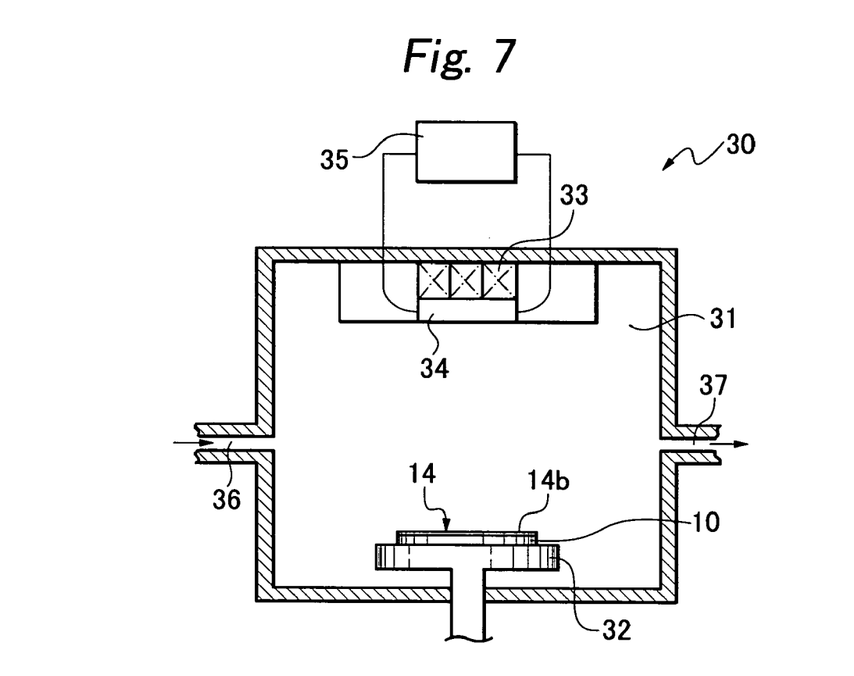
FIG. 7 is a sectional view showing an example of a film formation apparatus.

A reduced-pressure film formation apparatus 30 shown in FIG. 7 by way of example is employed for the step of forming the film. In the reduced-pressure film formation apparatus 30, a holding unit 32 to hold the wafer assembly in electrostatic fashion is disposed inside a sputtering chamber 31. A sputtering source 34 made of the metal is disposed at a position over and opposite the holding unit 32 in a state being supported by an excitation member 33. A high-frequency power source 35 is connected to the sputtering source 34. Besides, one side part of the sputtering chamber 31 is provided with an introduction port 36 to introduce a sputtering gas, and the other side part is provided with a pressure reduction port 37 communicating with a pressure reduction source.

Figure 8:
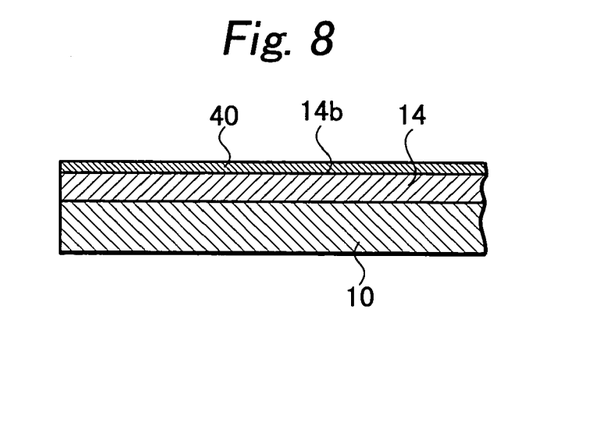
FIG. 8 is a partly enlarged sectional view showing the wafer whose back surface is covered with a metal film and the protective member.

Since the side of the protective member 10 is electrostatically held on the holding unit 32, the back surface 14b of the wafer 14 is held in opposition to the sputtering source 34. Herein, high-frequency power at a frequency of about 40 kHz is fed from the high-frequency power source 35 to the sputtering source 34 magnetized by the excitation member 33, the sputtering chamber 31 is brought into a reduced-pressure environment by reducing its internal pressure to 10-2 Pa –10-4 Pa or so through the pressure reduction port 37, and a plasma is generated by introducing the argon gas through the introduction port 36. Then, argon ions in the plasma collide against the sputtering source 34, whereby metal particles are driven out and are deposited on the back surface 14b of the wafer 14. In this way, the metal film 40 is formed on the back surface 14b of the wafer 14 as shown in FIG. 8 (film formation step). The film formation step is performed in the state where the wafer 14 thinned by the grinding is held integral with the protective member 10, so that even the wafer 14 whose rigidity has been lost can be easily handled. Moreover, the plane of the wafer 14 is in a flat state, so that the metal film 40 can be formed homogeneously and flatly. Incidentally, vacuum evaporation, CVD or the like may well be employed for the film formation step.

Figure 9:
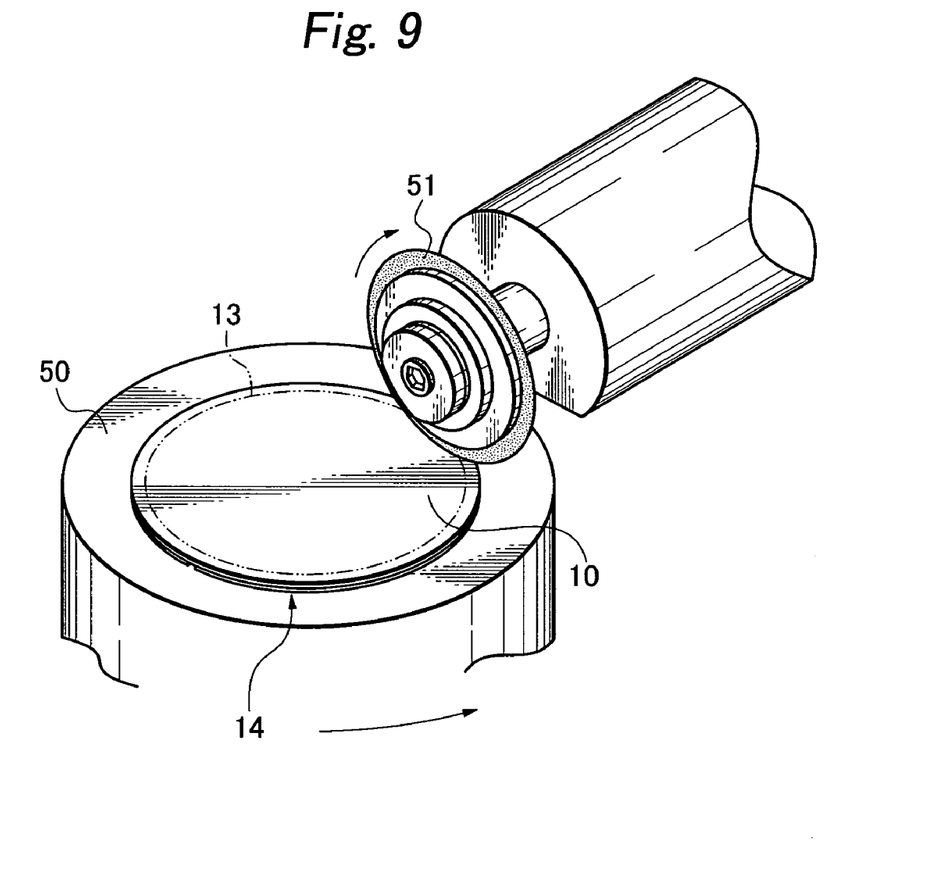
FIG. 9 is a perspective view showing an example of a protective-member cutting step.
Figure 10:
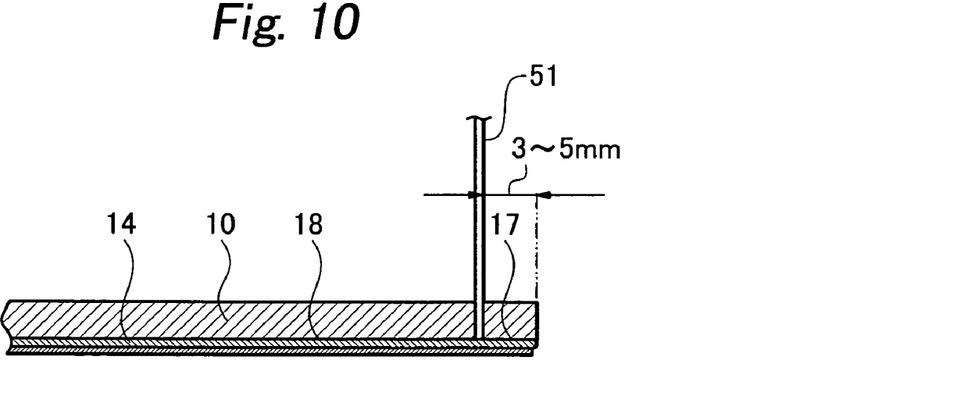
FIG. 10 is a sectional view showing the example of the protective-member cutting step.
Figure 11:
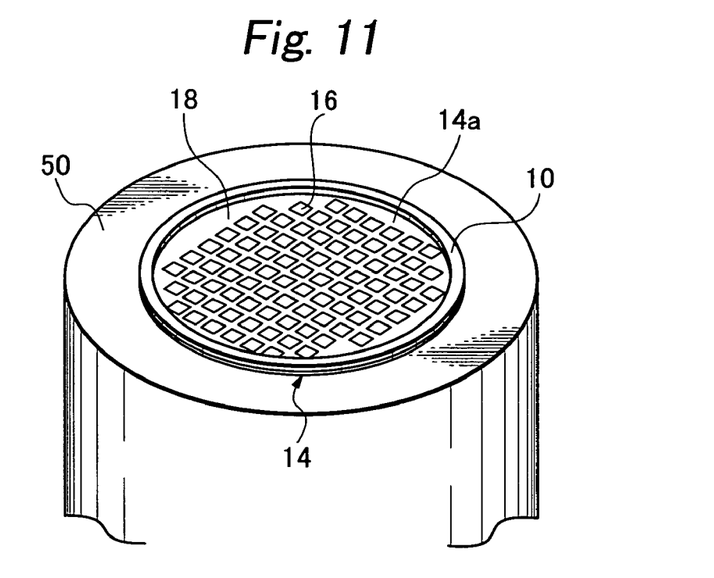
FIG. 11 is a perspective view showing the wafer and the protective member after finishing the protective-member cutting step.

Subsequently, as shown in FIG. 9, the resulting wafer assembly is brought into a state where the metal film 40 is held on a holding table 50 in a cutting apparatus, and where the protective member 10 is exposed. In this state, a cutting blade 51 adapted to rotate at high speed is applied to the protective member 10, and the holding table 50 is rotated. Thus, the cutting blade 51 is caused to cut the protective member 10 in correspondence with the thickness of this member along a cutting line 13 while the protective member 10 and the cutting blade 51 are being relatively rotated. In this way, a circular hole is bored along the cutting line 13 in only the protective member 10 without cutting the wafer 14, and the protective member 10 is left in a ring shape. A position at which the cutting blade 51 is applied, is the boundary between the device region 18 and the outer-peripheral surplus region 17 as shown in FIG. 10. After the protective member 10 has been partly cut in this manner, its part covering the device region 18 is removed. Thus, as shown in FIG. 11, the device region 18 of the wafer 14 is exposed in a state where the protective member 10 remaining in the ring shape reinforces the outer-peripheral region 17 of the wafer 14 and supports the thin wafer 14 in a manner to spread it like a drumhead (protective-member cutting step). Since the adhesive agent 11 is not adherent to the device region 18, the troublesome operation of removing this adhesive agent is dispensed with.

Figure 12:
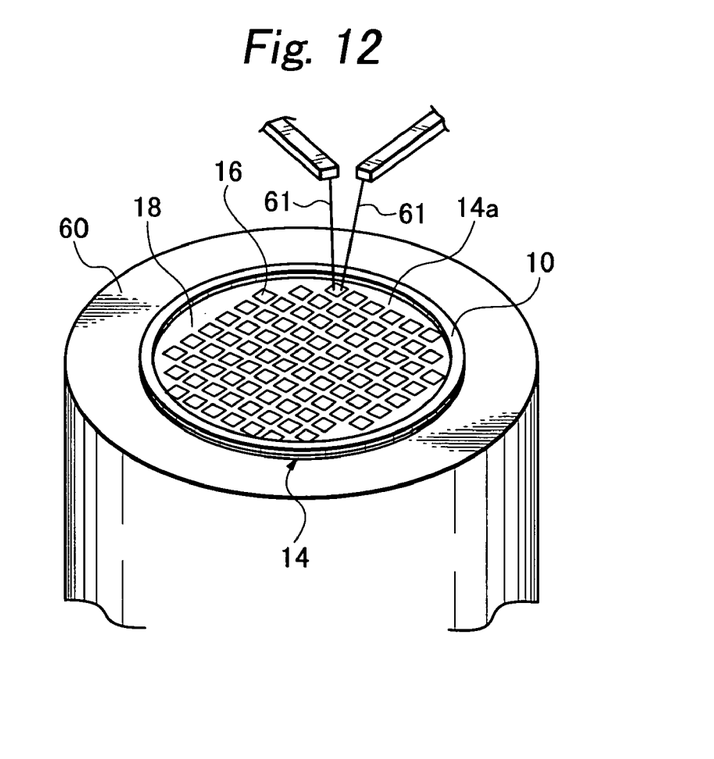
FIG. 12 is a perspective view showing an example of a test step.

Subsequently, as shown in FIG. 12, the back surface side of the wafer 14 on which the metal film 40 has been formed is held on a holding table 60, and probes 61 are brought into contact with the device 16 on the front surface side of the wafer 14, whereby the electrical characteristics of each individual device are tested (test step). On this occasion, the holding table 60 is ground, thereby grounding the wafer 14 through the metal film 40. The test step is also performed in the state where the protective member 10 and the wafer 14 are integral, and where the outer-peripheral surplus region 17 of the wafer 14 is supported by the protective member 10. Therefore, a stable supporting state and easy handling are ensured, and the test operation can be smoothly carried out.

Figure 13:
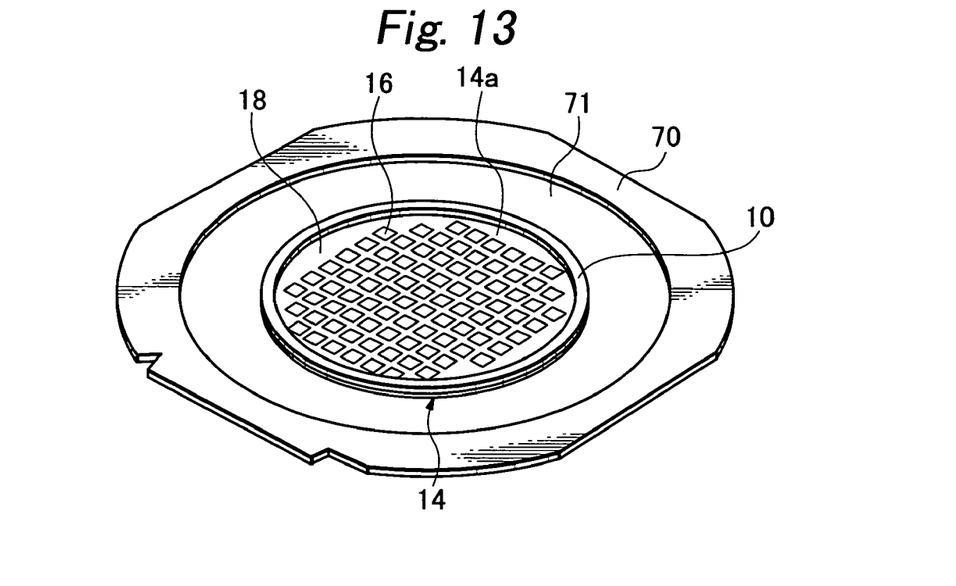
FIG. 13 is a perspective view showing a state where the wafer, on which the protective member is left in a ring shape and whose back surface is formed with the metal film, is integral with a frame through a tape.
Figure 14:
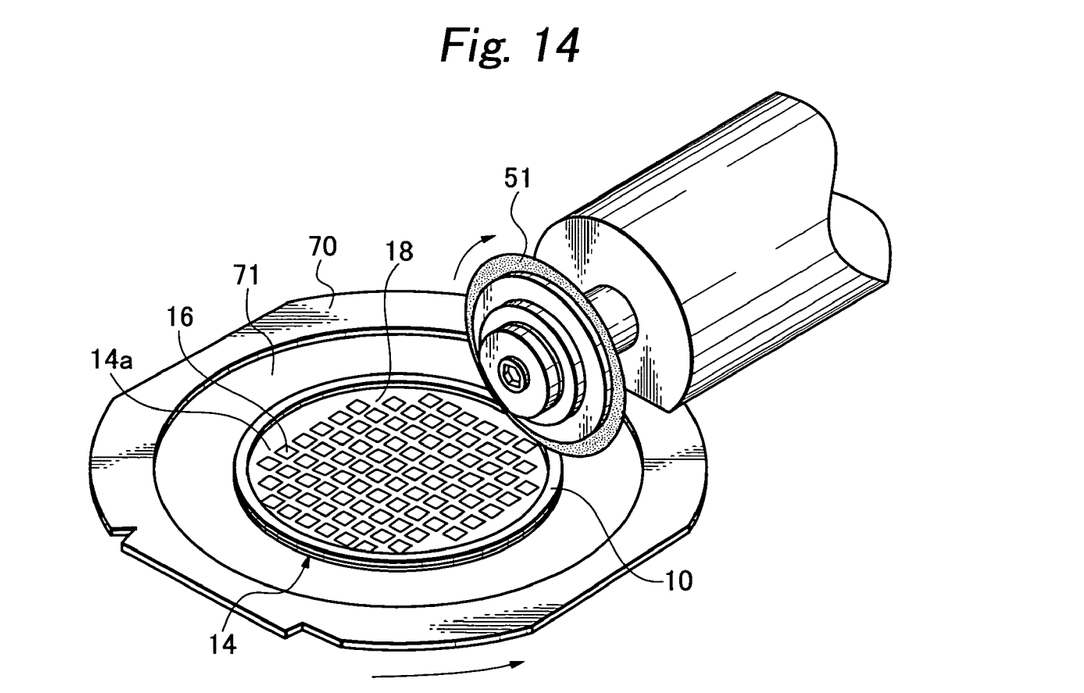
FIG. 14 is a perspective view showing an example of an outer-peripheral-surplus-region separation step.
Figure 15:
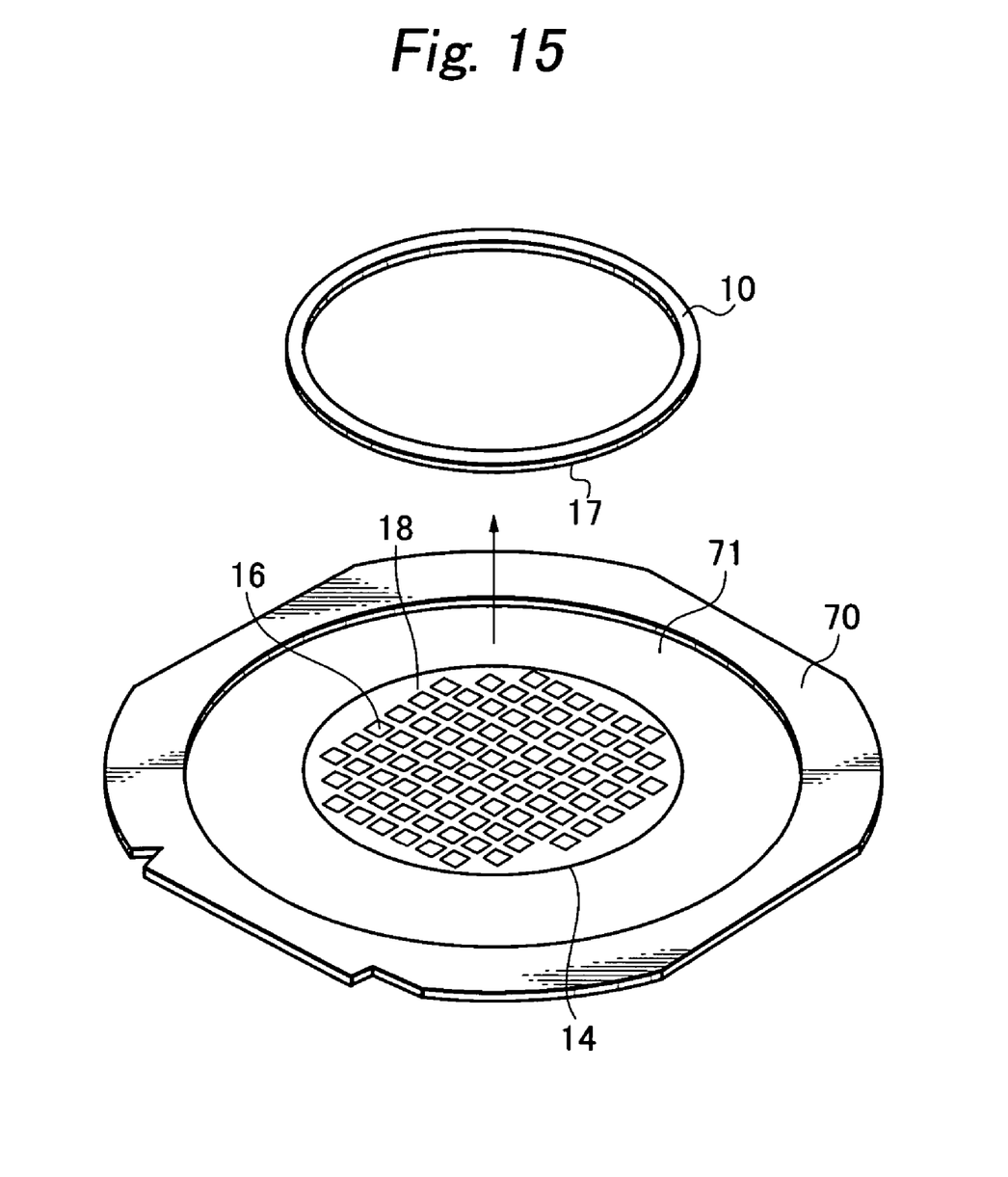
FIG. 15 is a perspective view showing a state where the wafer from which an outer-peripheral surplus region and the ring-shaped protective member are removed is integral with the frame through the tape.

After finishing the test step, the resulting wafer assembly is brought into a state shown in FIG. 13 where the back surface side of the wafer 14 formed with the metal film 40 is stuck on the adhesive surface of a tape 71 which has a frame 70 stuck to its outer peripheral part, and where the front surface 14a of the wafer 14 is exposed. Herein, as shown in FIG. 14, the wafer 14 which is integral with the frame 70 through the tape 71 is rotated, and the cutting blade 51 rotating at high speed is caused to cut the wafer 14 inside the ring-shaped protective member 10 to the extent of not cutting the tape 71, whereby the wafer 14 is cut along the inner periphery of the protective member 10. After such cutting, the outer-peripheral surplus region 17 and the protective member 10 are removed as shown in FIG. 15, whereby the wafer 14 becomes integral with the frame 70 in a state where its outer-peripheral surplus region 17 is separated and where only its device region 18 is stuck on the tape 71 (outer-peripheral-surplus-region separation step).

Figure 16:
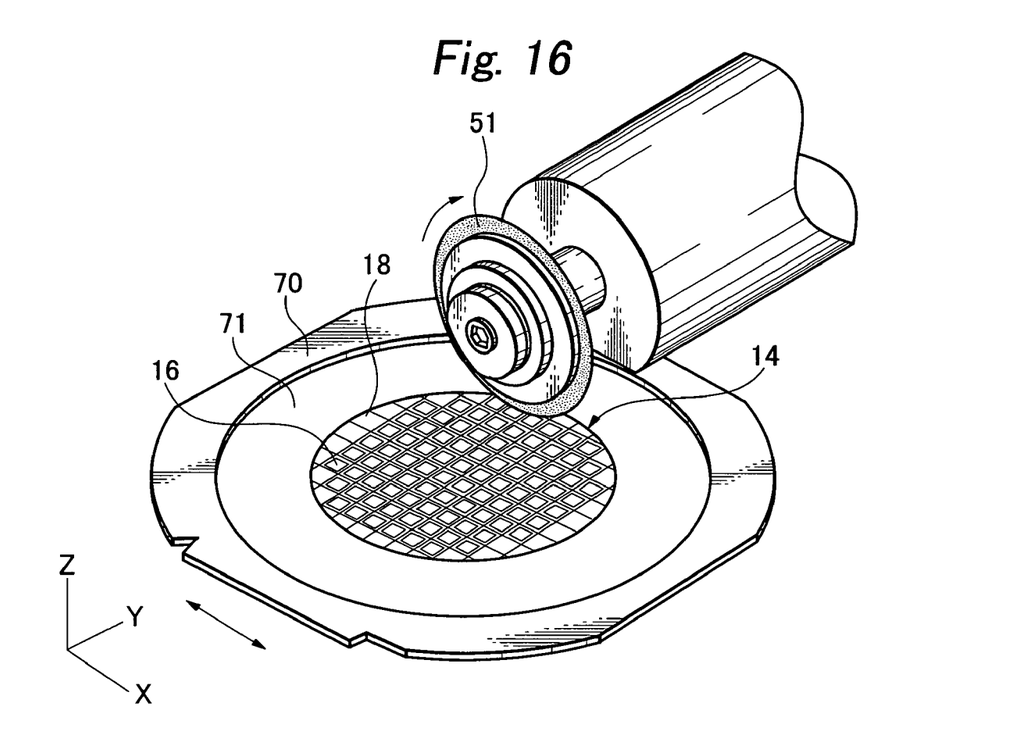
FIG. 16 is a perspective view showing an example of a dicing step.

Subsequently, as shown in FIG. 16, the resulting wafer 14 is moved in the direction of an X-axis, and the cutting blade 51 adapted to rotate at high speed is caused to cut the streets of the wafer 14 horizontally or vertically, whereby the wafer 14 is diced into the individual devices 16 (dicing step).

Figure 17:
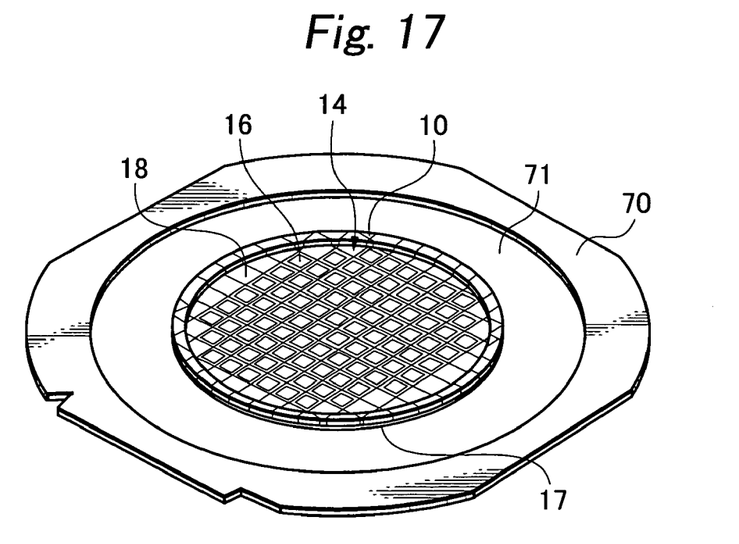
FIG. 17 is a perspective view showing another example of the dicing step.

By the way, in a case where the wafer 14 including the outer-peripheral surplus region 17 and the protective member 10 which are not removed, as shown in FIG. 17, is cut vertically and horizontally, the outer-peripheral-surplus-region separation step is not required.

Although the case of processing the substantially circular wafer has been exemplified in the above description, the present invention is also applicable to a case of processing a rectangular wafer. In the case of processing a rectangular wafer 80 shown in FIG. 18 by way of example, a protective-member sticking step proceeds in such a way that a rectangular protective member 84 is stuck to an outer-peripheral surplus region 82 surrounding a rectangular device region 81, through an adhesive agent 83 corresponding to the shape of the outer-peripheral surplus region 82. A back-surface grinding step, a film formation step and a test step proceed in the same ways as in the case of the circular wafer.

Figure 18:
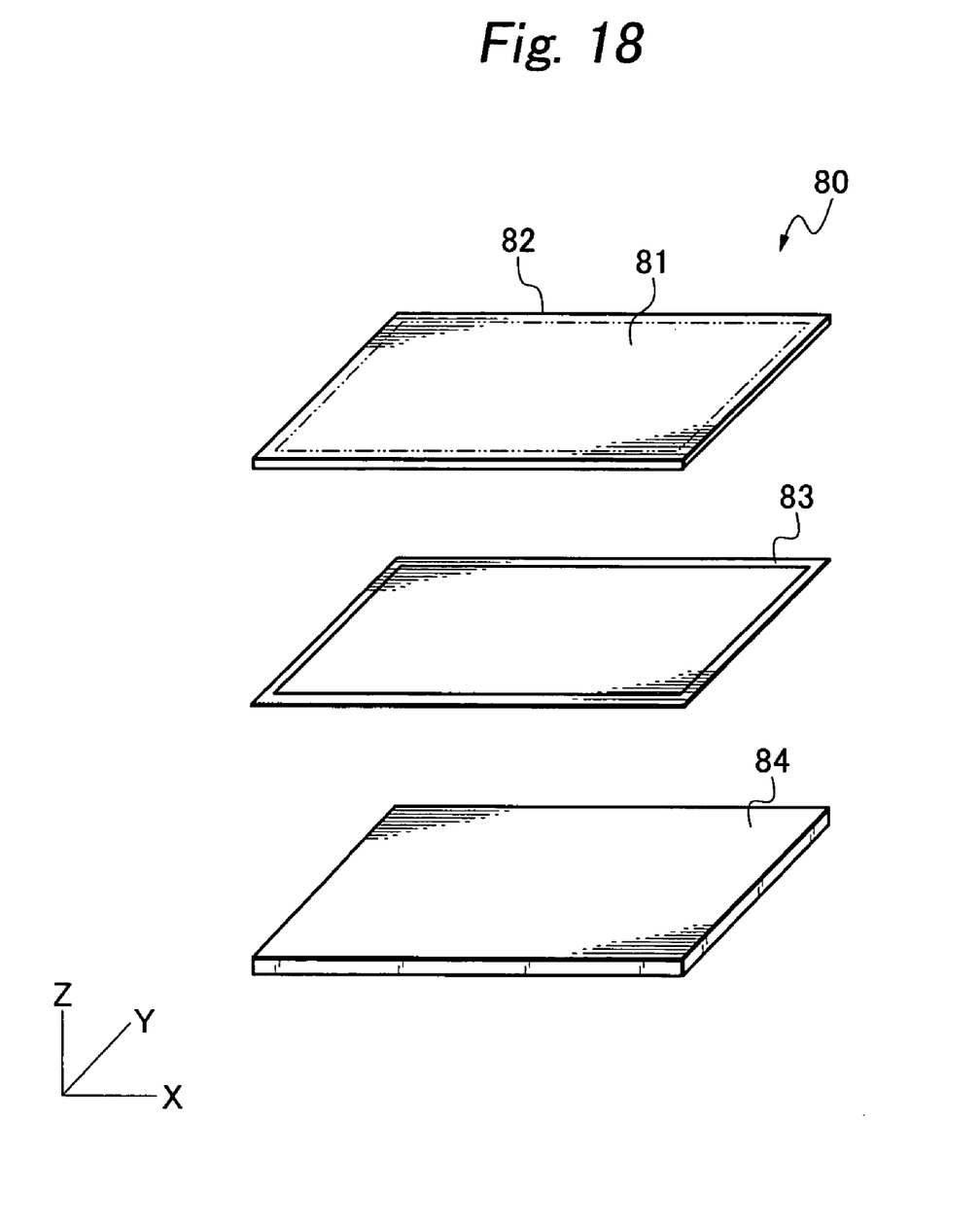
FIG. 18 is a perspective view showing a wafer, an adhesive agent and a protective member which are rectangular.

At a protective-member cutting step, the protective member 84 is rectilinearly cut so as to remain in a frame (rectangular ring) shape, in such a way that the wafer 80 is moved in the direction of an X-axis and that the protective member 84 and the cutting blade 51 are relatively rotated 90 degrees in succession. Subsequently, that part of the protective member 84 covering the device region 81 is removed. Thereafter, the test step is performed by the same method as in the case of the circular wafer. A dicing step is also the same as in the case of the circular wafer. On this occasion, in a case where an outer-peripheral-surplus-region separation step is performed before the dicing step, the outer-peripheral surplus region 82 and the protective member 84 can be removed in such a way that the wafer 80 is rectilinearly cut along the inner periphery of the protective member 84 while being moved in the direction of the X-axis, and that the wafer 80 is cut similarly rectilinearly by rotating this wafer 90 degrees in succession. On the other hand, in a case where the outer-peripheral-surplus-region separation step is not performed, the outer-peripheral surplus region 82 and the protective member 84 are cut together with the device region 81 in the same way as in the case of the circular wafer.

According to the present invention thus far described, a wafer is reinforced by a protective member. Therefore, the handling of the wafer is facilitated during processing, and the invention can be utilized especially for processing a wafer to be formed thin.

What is claimed is:

1. A method for processing a wafer whose front surface includes a device region formed with a plurality of devices, and an outer-peripheral surplus region surrounding the device region, comprising at least:

sticking a protective member to the outer-peripheral surplus region through an adhesive agent; and grinding a back surface of the wafer with the protective member held on a chuck table of a grinding apparatus and, subsequently, forming a film on the back surface of the wafer bearing the protective member stuck to the front surface;

cutting the protective member by applying a cutting blade to the protective member and while the protective member and the cutting blade are being relatively rotated, so that the protective member stuck to the outer-peripheral surplus region may remain in a ring shape; and removing the part of the protective member covering the device region cut in said cutting of the protective-member to expose the device region, and electrically testing the devices.

2. A method for processing a wafer according to claim 1, further comprising dicing the wafer into the individual devices.

3. A method for processing a wafer according to claim 2, further comprising, prior to said dicing of the wafer, separating the outer-peripheral surplus region from the device region by cutting the wafer along an inner periphery of the protective member remaining in the ring shape.

4. A method for processing a wafer according to claim 1, wherein the protective member is formed of one member selected from the group consisting of glass, silicon and ceramics, while the adhesive agent is formed of a polyimide resin.

* * * * *